United States Patent
Nishio (10) Patent No.: US 9,332,677 B2
(45) Date of Patent: May 3, 2016

(54) ELECTRONIC DEVICE (75) Inventor: Norihiko Nishio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 233 days.

(21) Appl. No.: 14/110,674

(22) PCT Filed: Apr. 13, 2012

(86) PCT No.: PCT/JP2012/060647
§ 371 (c)(1),
(2), (4) Date: Oct. 8, 2013

(87) PCT Pub. No.: WO2012/141339
PCT Pub. Date: Oct. 18, 2012

(65) Prior Publication Data
US 2014/0036444 A1 Feb. 6, 2014

(30) Foreign Application Priority Data

Apr. 13, 2011 (JP) .................................. 2011-089296

(51) Int. Cl.
*H05K 7/20* (2006.01)
*G06F 1/20* (2006.01)

(52) U.S. Cl.
CPC ........ *H05K 7/20736* (2013.01); *H05K 7/20145* (2013.01); *H05K 7/20563* (2013.01)

(58) Field of Classification Search
CPC ...................... H05K 7/20136–7/20145; H05K 7/20554–7/20581; H05K 7/20718–7/20736
See application file for complete search history.

(56) References Cited

U.S. PATENT DOCUMENTS

| | | | | |
|---|---|---|---|---|
| 3,956,673 A | * | 5/1976 | Seid | H05K 7/20572 165/170 |
| 5,915,463 A | * | 6/1999 | Romero | H01L 23/473 165/185 |
| 6,091,609 A | * | 7/2000 | Hutson et al. | 361/794 |
| 6,424,526 B1 | * | 7/2002 | Heard | 361/679.47 |
| 6,751,094 B2 | * | 6/2004 | Kolb et al. | 361/679.33 |
| 6,778,386 B2 | * | 8/2004 | Garnett et al. | 361/679.48 |
| 6,924,977 B2 | * | 8/2005 | Bestwick et al. | 361/679.51 |

(Continued)

FOREIGN PATENT DOCUMENTS

| | | |
|---|---|---|
| JP | 2002-237178 A | 8/2002 |
| JP | 2006-202822 A | 8/2006 |

(Continued)

OTHER PUBLICATIONS

International Search Report (ISR) (PCT Form PCT/ISA/210), in PCT/JP2012/060647, dated Jul. 24, 2012.

*Primary Examiner* — Robert J Hoffberg
(74) *Attorney, Agent, or Firm* — McGinn IP Law Group, PLLC.

(57) ABSTRACT

In an electronic device, a substrate mounting unit is provided at a front side inside a housing, and contains a plurality of electronic substrates under a state where faces of any two mutually adjacent ones of the plurality of electronic substrates are opposite to each other. A power supply unit is provided at a position which is located at a rear side inside the housing and is located behind the substrate mounting unit, and supplies the plurality of electronic substrates with electric power. A power-supply fan unit, which is provided at a rear side of the power supply unit, takes in air outside the housing from the power-supply air intake opening, and discharges the taken-in air to an outside of a rear side of the housing via the substrate mounting unit and the power supply unit.

14 Claims, 8 Drawing Sheets

(56) References Cited

U.S. PATENT DOCUMENTS

| | | | |
|---|---|---|---|
| 7,554,803 B2 * | 6/2009 | Artman et al. | 361/695 |
| 7,722,359 B1 * | 5/2010 | Frangioso et al. | 439/61 |
| 7,988,063 B1 * | 8/2011 | Dufresne et al. | 236/49.3 |
| 8,358,511 B2 * | 1/2013 | Huels et al. | 361/788 |
| 8,380,967 B2 * | 2/2013 | Kinouchi | 713/1 |
| 8,737,067 B1 * | 5/2014 | Kim et al. | 361/690 |
| 8,800,884 B2 * | 8/2014 | Dufresne et al. | 236/49.3 |
| 2012/0120596 A1 * | 5/2012 | Bechtolsheim | 361/679.48 |
| 2013/0235524 A1 * | 9/2013 | Baba et al. | 361/695 |
| 2013/0267161 A1 * | 10/2013 | Iqbal | 454/184 |
| 2014/0002988 A1 * | 1/2014 | Roesner et al. | 361/679.49 |
| 2014/0254074 A1 * | 9/2014 | Kim et al. | 361/679.4 |

FOREIGN PATENT DOCUMENTS

| | | |
|---|---|---|
| JP | 2010-80456 A | 4/2010 |
| WO | WO 2008/084632 A1 | 7/2008 |

\* cited by examiner

Related Art

Fig. 7A

Related Art

ELECTRONIC DEVICE

TECHNICAL FIELD

The present invention relates to electronic devices that include, for example, a plurality of electronic substrates on each of which electronic parts are mounted.

BACKGROUND ART

In electronic devices, such as a personal computer, a plurality of electronic substrates on each of which electronic parts are mounted, as well as a power supply which supplies these electronic substrates with electric power, are installed with a high density. Actuation of such an electronic device causes the electronic substrates and the power supply inside the electronic device to be exposed to intense heat. Thus, a large number of electronic devices employ a structure in which the electronic substrates and the power supply are cooled with cooling fans.

Figure 7A:
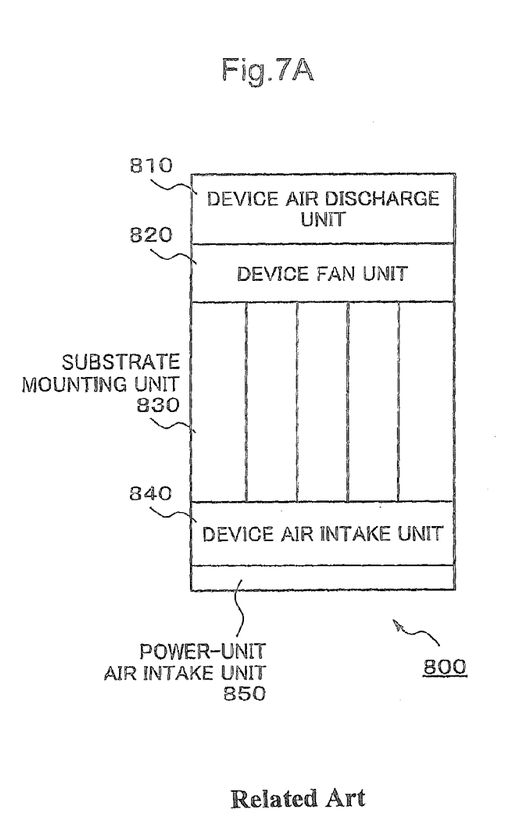
FIG. 7A is a diagram schematically illustrating a first example of a cooling structure of a typical electronic device and is a schematic diagram of an electronic device from a front view.
Figure 7B:
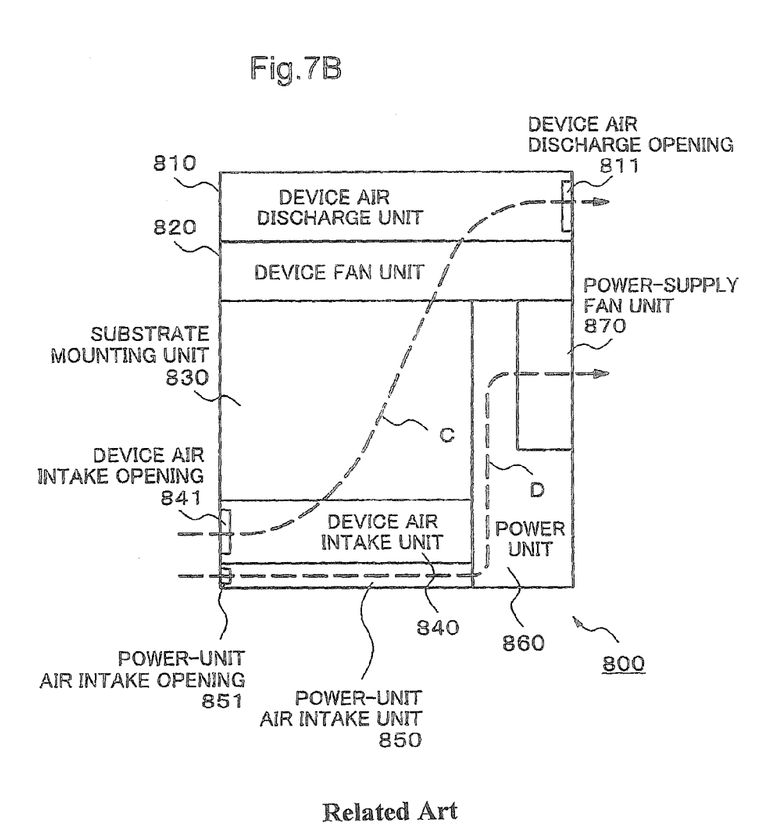
FIG. 7B is a diagram schematically illustrating a first example of a cooling structure of a typical electronic device and is a schematic diagram of an electronic device from a side view.

FIG. 7A and FIG. 7B schematically illustrates a first example of a cooling structure of a typical electronic device. FIG. 7A is a schematic diagram of a typical electronic device from a front view, and FIG. 7B is a schematic diagram of the typical electronic device from a side view. Here, in FIG. 7B, the left-hand side and the right-hand side of the figure are a front side and a rear side of an electronic device 800, respectively, and the upper side and the lower side of the figure are an upper side and a lower side of the electronic device 800, respectively. Further, with respect to each of units included in the electronic device 800, similarly, the left-hand side and the right-hand side of the figure are a front side and a rear side of the relevant unit, respectively, and the upper side and the lower side of the figure is an upper side and a lower side of the relevant unit, respectively.

As shown in FIG. 7A, the electronic device 800 includes a device air discharge unit 810, a device fan unit 820, a substrate mounting unit 830, a device air intake unit 840 and a power-supply air intake unit 850.

As shown in FIG. 7B, a power supply unit 860 and a power-supply fan unit 870 are provided behind the substrate mounting unit 830. Further, a device air intake opening 841 is provided at the front side of the device air intake unit 840, and a power-supply air intake opening 851 is provided at the front side of the power-supply air intake unit 850. Moreover, a plurality of electronic substrates (not illustrated) is mounted in the substrate mounting unit 830.

As shown in FIG. 7B, cooling inside the electronic device 800 is performed so as to be separated into a cooling route C for cooling the substrate mounting unit 830 (including the electronic substrates), and a cooling route D for cooling the power supply unit 860.

First, the cooling of the electronic substrates and the like inside the substrate mounting unit 830 is performed so as to follow the cooling route C in such a way as described below. That is, the drive of the device fan unit 820 causes outside air to flow into the device air intake opening 841 which is located at the front side of the electronic device 800. This outside air passes through the device air intake unit 840, flows from the lower side to the upper side of the substrate mounting unit 830, and flows out from the device air discharge opening 811 via the device discharge unit 810. In this way, the electronic substrates and the like inside the substrate mounting unit 830 are cooled by causing the device fan unit 820 to take in outside air to the inside of the substrate mounting unit 830.

The cooling of the power supply unit 860 is performed so as to follow the cooling route D in such a way as described below. That is, the drive of the power-supply fan unit 870 causes outside air to flow into the power-supply air intake opening 851 which is located at the front side of the electronic device 800. This outside air passes through the power supply air intake unit 850, enters into the power supply unit 860, and flows out from the power-supply fan unit 870. In this way, the power supply unit 860 is cooled by causing the power-supply fan unit 870 to take in outside air to the inside of the power supply unit 860.

Figure 8A:
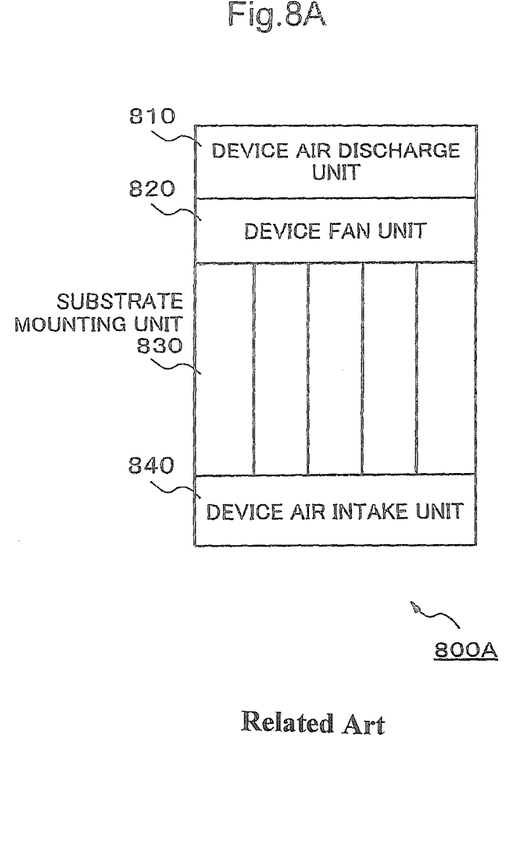
FIG. 8A is a diagram schematically illustrating a second example of a cooling structure of a typical electronic device and is a schematic diagram of an electronic device from a front view.
Figure 8B:
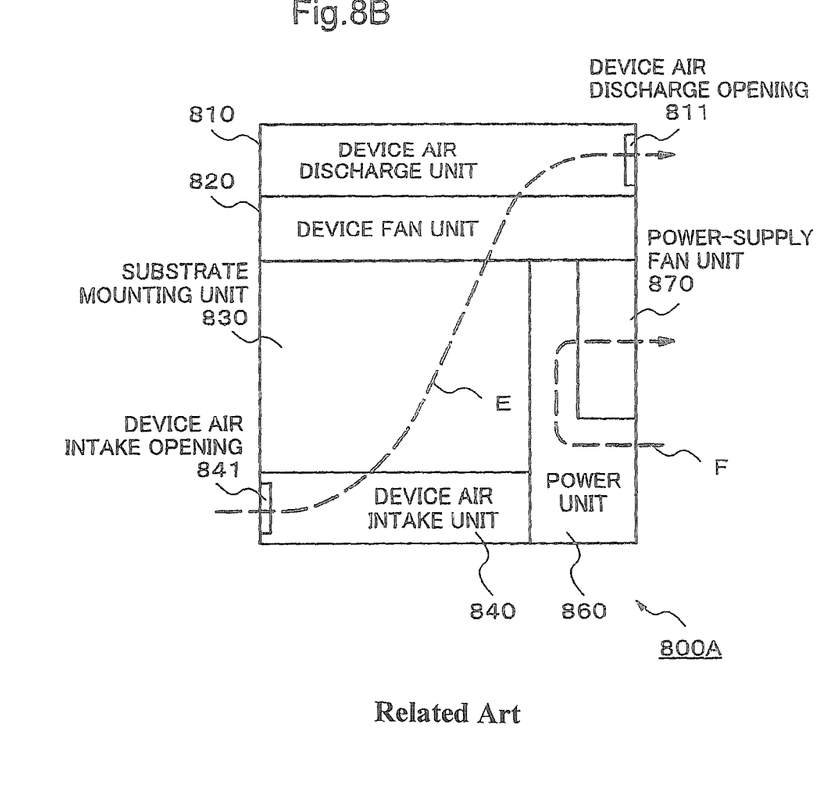
FIG. 8B is a diagram schematically illustrating a second example of a cooling structure of a typical electronic device and is a schematic diagram of an electronic device from a side view.

Further, a different example of a cooling structure of a typical electronic device will be described below. FIG. 8A and FIG. 8B schematically illustrates a second example of a cooling structure of a typical electronic device. FIG. 8A is a schematic diagram of a typical electronic device from a front view, and FIG. 8B is schematic diagram of the typical electronic device from a side view. Here, in FIG. 8B, just like in the description of FIG. 7B, the left-hand side and the right-hand side of the figure are a front side and a rear side of the electronic device 800A, respectively, and the upper side and the lower side of the figure are an upper side and a lower side of the electronic device 800A, respectively.

As shown in FIG. 8A and FIG. 8B, the electronic device 800A is different from the electronic device 800 shown in FIG. 7A and FIG. 7B in the respect that the electronic device 800A does not include the power-supply air intake unit 850. In this way, in order to reduce the height of the electronic device 800A itself, the electronic device 800A adopts a higher density installation than that of the electronic device 800. In this case, as shown in FIG. 8B, cooling inside the electronic device 800A is performed so as to be separated into a cooling route E for cooling the substrate mounting unit 830 and a cooling route F for cooling the power supply unit 860. The cooling route E is the same as the cooling route C of FIG. 7B. Meanwhile, in the cooling route F, differing from the cooling route D of FIG. 7B, the power-supply fan unit 870 takes in air outside of the rear side of the electronic device 800A, and discharges air to the same outside of the rear side thereof.

Further, for example, in Japanese Unexamined Patent Application Publication No. 2002-237178 (PTL 1), there has been disclosed a technology in which a power supply unit including an air discharge fan is located behind a hard disk drive (HDD) unit.

CITATION LIST

Patent Literature

PTL 1: Japanese Unexamined Patent Application Publication No. 2002-237178

SUMMARY OF INVENTION

Technical Problem

Nevertheless, in the electronic device 800 shown in FIG. 7A and FIG. 7B, it has been necessary to separately provide the device air intake opening 841 for taking in air for use in cooling of the electronic substrates and the power-supply air intake opening 851 for taking in air for use in cooling of the power supply unit 860 at the front side of the electronic device 800. For this reason, it has been necessary to increase the height of the electronic device 800. Further, in the electronic device 800A shown in FIG. 8A and FIG. 8B, the power-supply fan unit 870 takes in air outside of the rear side of the electronic device 800A, and discharges air to the same outside of the rear side thereof. For this reason, the power-supply fan unit 870 takes in air having been discharged from the power-supply fan unit 870 itself and the device fan unit 811, so that the power supply unit 860 has been likely to be exposed to intense heat. Further, in the technology disclosed in PTL 1, since heat having been generated by the HDD unit flows into the power supply unit, similarly, the power supply unit has been likely to be exposed to intense heat.

The present invention has been made in view of such situations, and it provides a technology which makes it possible to keep the size of an apparatus small, and at the same time, efficiently cool a power supply unit which is located behind a substrate mounting unit.

Solution to Problem

An electronic device according to an aspect of the present invention includes a housing that contains a plurality of electronic substrates on each of which an electronic part is mounted; a substrate mounting unit that is provided at a front side inside the housing, and that contains the plurality of electronic substrates under a state where faces of any two mutually adjacent ones of the plurality of electronic substrates are opposite to each other; a power supply unit that is provided at a position which is located at a rear side inside the housing and is located behind the substrate mounting unit, and that supplies the plurality of electronic substrates with electric power; an air intake opening that is provided at a front side of the substrate mounting unit in order to take in air outside the housing from a front side of the housing to an inside of the housing; and an air blowing unit that is provided at a rear side of the power supply unit, and that takes in air outside the housing from the air intake opening and discharges the taken-in air to an outside of a rear side of the housing via the substrate mounting unit and the power supply unit. Further, each of the plurality of electronic substrates has a first face on which an exothermic electronic part is mounted and a second face on which the exothermic electronic part is not mounted, and the substrate mounting unit is provided with a heat radiation path that is formed between every two mutually adjacent ones of the plurality of electronic substrates, and is formed so as to be along the second face of each of the plurality of electronic substrates, and that conducts air taken in by the air blowing unit to the power supply unit.

Advantageous Effect of Invention

According to the technology associated with the aspect of the present invention, it is possible to keep the size of an apparatus small, and at the same time, efficiently cool a power supply unit which is located behind a substrate mounting unit.

REFERENCE SIGNS LIST

100 Housing
110 Device air discharge unit
111 Device air discharge opening
120 Device fan unit
130 Substrate mounting unit
131 Power-supply air intake opening
132 Electronic substrate
132*a* Exothermic electronic part
132*b* First face
132*c* Second face
133 Front plate
133*a* Screw retaining unit
133*b* Connector socket
133*c* Connector socket
134 Heat radiation path formation unit
135 Heat radiation path
136 Substrate unit
137 Relay substrate
140 Device air intake unit
141 Device air intake opening
160 Power supply unit
170 Power-supply fan unit
1000 Electronic device

DESCRIPTION OF EMBODIMENT

Embodiment

Figure 1A:
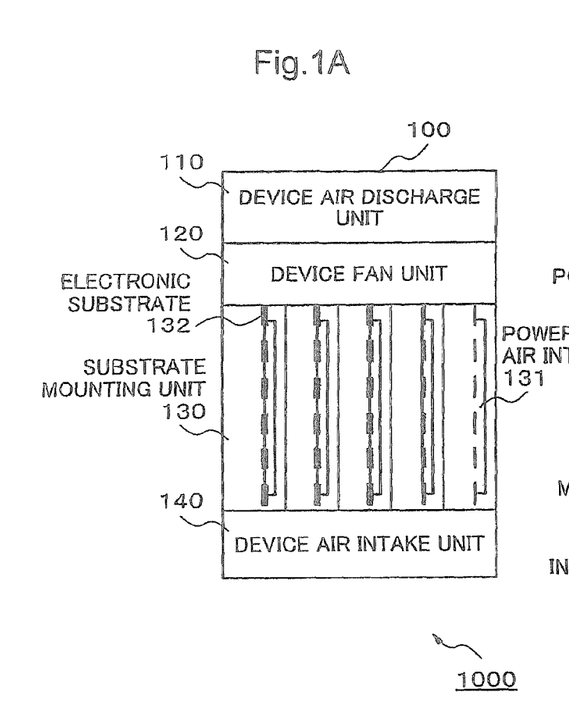
FIG. 1A is a diagram schematically illustrating a cooling structure of an electronic apparatus according to an embodiment of the present invention and is a schematic diagram of an electronic device from a front view.
Figure 1B:
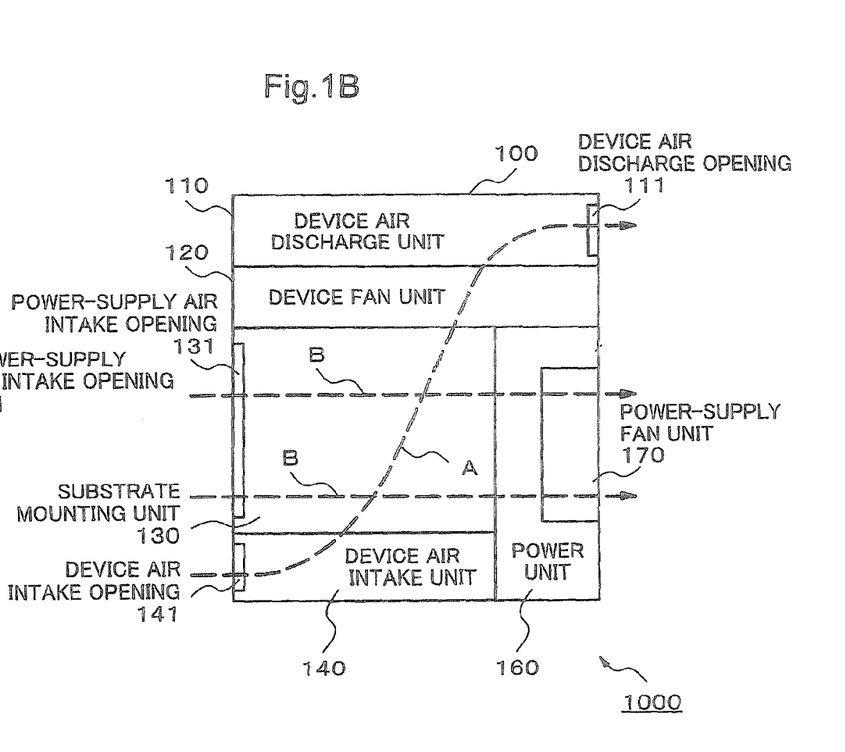
FIG. 1B is a diagram schematically illustrating a cooling structure of an electronic apparatus according to an embodiment of the present invention and is a schematic diagram of an electronic device from a side view.
Figure 2:
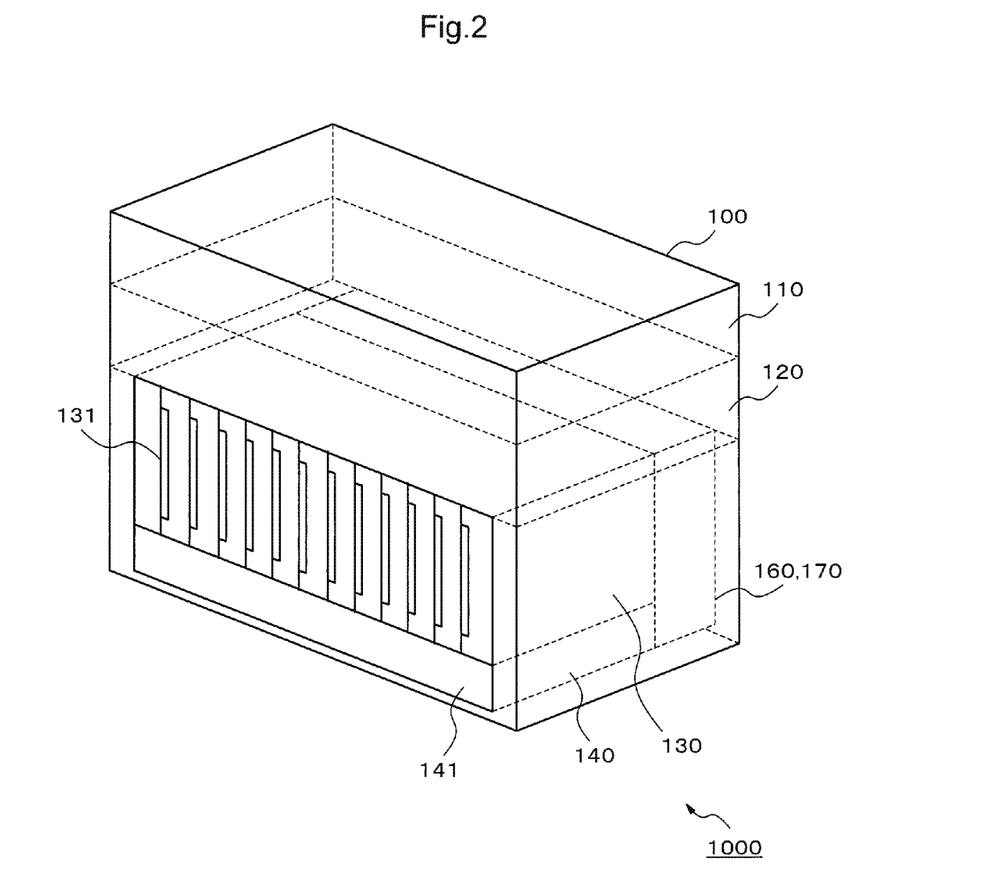
FIG. 2 is a perspective view schematically illustrating a cooling structure of an electronic apparatus according to an embodiment of the present invention from a front side.
Figure 3:
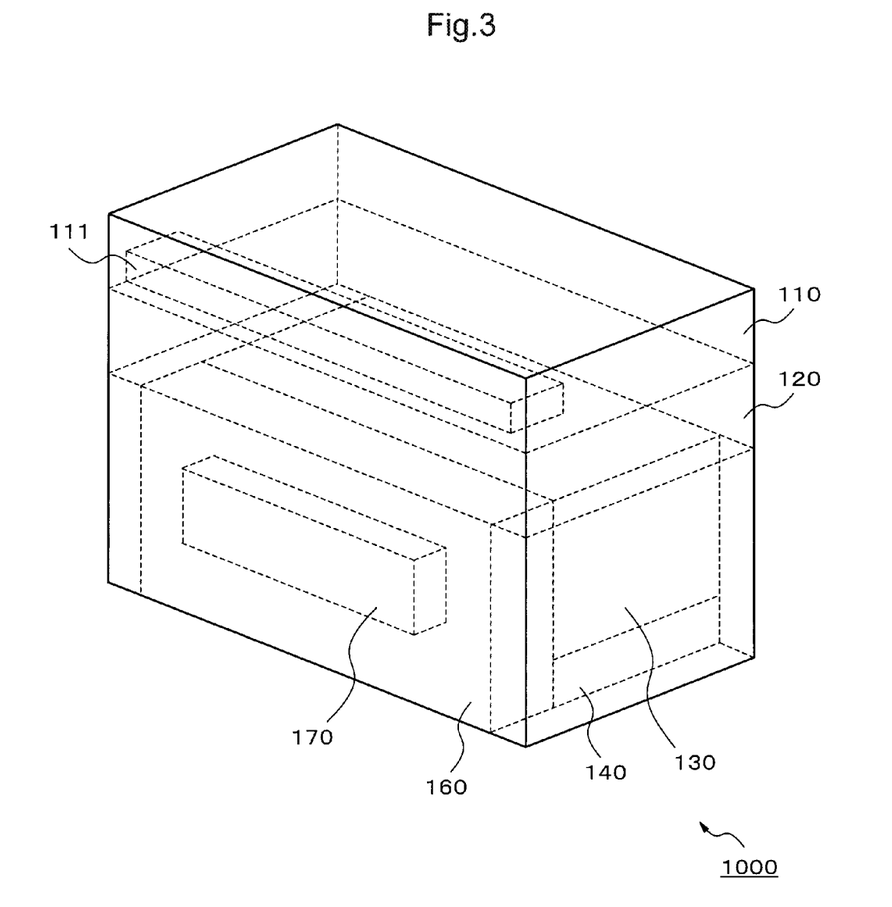
FIG. 3 is a perspective view schematically illustrating a cooling structure of an electronic apparatus according to an embodiment of the present invention from a rear side.

FIG. 1A and FIG. 1B schematically illustrates a structure of an electronic device 1000 according to an embodiment of the present invention. FIG. 1A is a schematic diagram of the electronic device 1000 from a front view, and FIG. 1B is a schematic diagram of the electronic device from a side view. Here, in FIG. 1B, the left-hand side and the right-hand side of the figure are a front side and a rear side of the electronic device 1000, respectively, and the upper side and the lower side of the figure are an upper side and a lower side of the electronic device 1000, respectively. Further, with respect to each of units included in the electronic device 1000, similarly, the left-hand side and the right-hand side of the figure are a front side and a rear side of the relevant unit, respectively, and the upper side and the lower side of the figure is an upper side and a lower side of the relevant unit, respectively. FIG. 2 is a perspective view schematically illustrating the electronic device 1000 from a front side. FIG. 3 is a perspective view schematically illustrating the electronic device 1000 from a rear side.

As shown in FIG. 1A, FIG. 1B, FIG. 2 and FIG. 3, the electronic device 1000 is configured to include a housing 100, a device air discharge unit 110, a device air discharge opening 111, a device fan unit 120, a substrate mounting unit 130, a power-supply air intake opening 131, a device air intake unit 140, a device air intake opening 141, a power supply unit 160 and a power-supply fan unit 170. In addition, the air blowing unit according to the aspect of the present invention corresponds to the power-supply fan unit 170, and the second air blowing unit according thereto corresponds to the device fan unit 120. The power-supply air intake opening 131 corresponds to the air intake opening according to the aspect of the present invention, and the device air intake opening 141 corresponds to a second air intake opening according to another aspect of the present invention.

The housing 100 is formed in order to particularly contain electronic substrates (not illustrated) inside the substrate mounting unit 130. Besides the substrate mounting unit 130, the housing 100 also contains all the device air discharge unit 110, the device air discharge opening 111, the device fan unit 120, the power-supply air intake opening 131, the device air intake unit 140 and the device air intake opening 141.

The device air discharge unit 110 is provided at the uppermost side inside the housing 100. The device air discharge opening 111 is provided at the rear side of the device air discharge unit 110. The device air discharge unit 110 is provided in order to discharge air, which has been taken in by the device fan unit 120 from the device air intake opening 141 to the inside of the housing 100, from the device air discharge opening 111 to the outside of the housing 100.

The device fan unit 120 is provided between the device air discharge unit 110 and the substrate mounting unit 130 in order to cool the substrate mounting unit 130. The device fan unit 120 takes in air outside the housing 100 from the device air intake opening 141 and discharges this taken-in air to the outside of the upper rear side of the housing 100 via the substrate mounting unit 130.

Figure 4A:
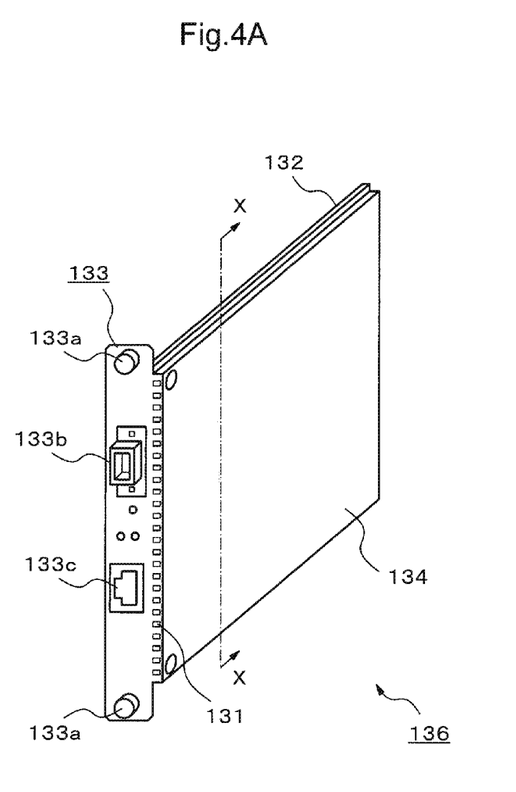
FIG. 4 is a diagram illustrating a configuration of a substrate unit including an electronic substrate.
Figure 5A:
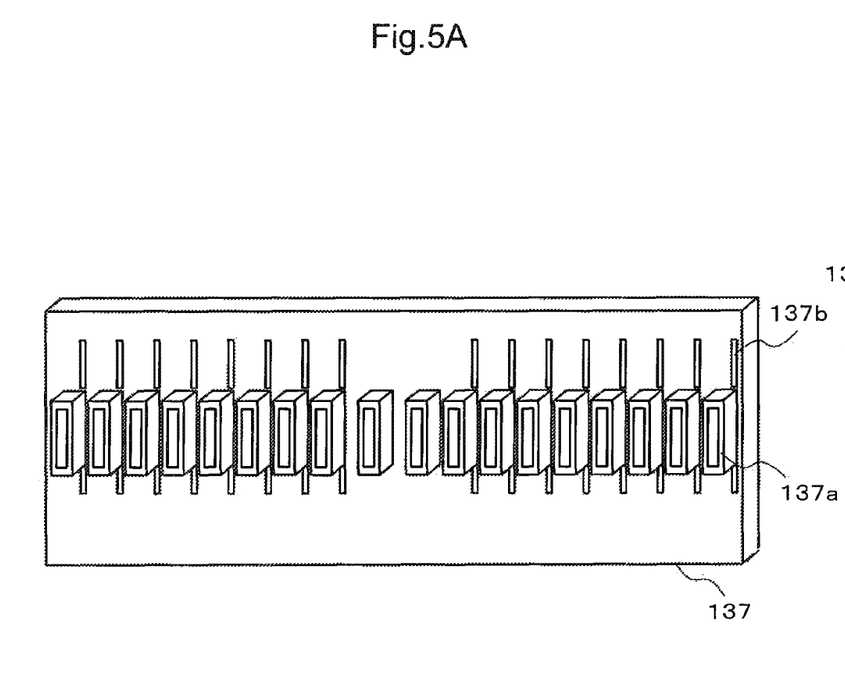
FIG. 5A is a diagram illustrating a structure of a substrate unit and is a diagram illustrating a configuration of a relay substrate.
Figure 5B:
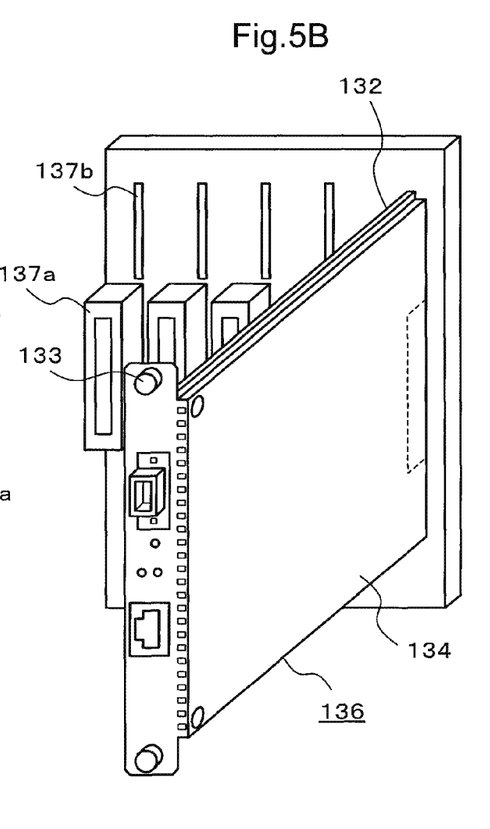
FIG. 5B is a diagram illustrating a structure of a substrate unit and is a diagram illustrating a state where a substrate unit is attached to a relay substrate.
Figure 6:
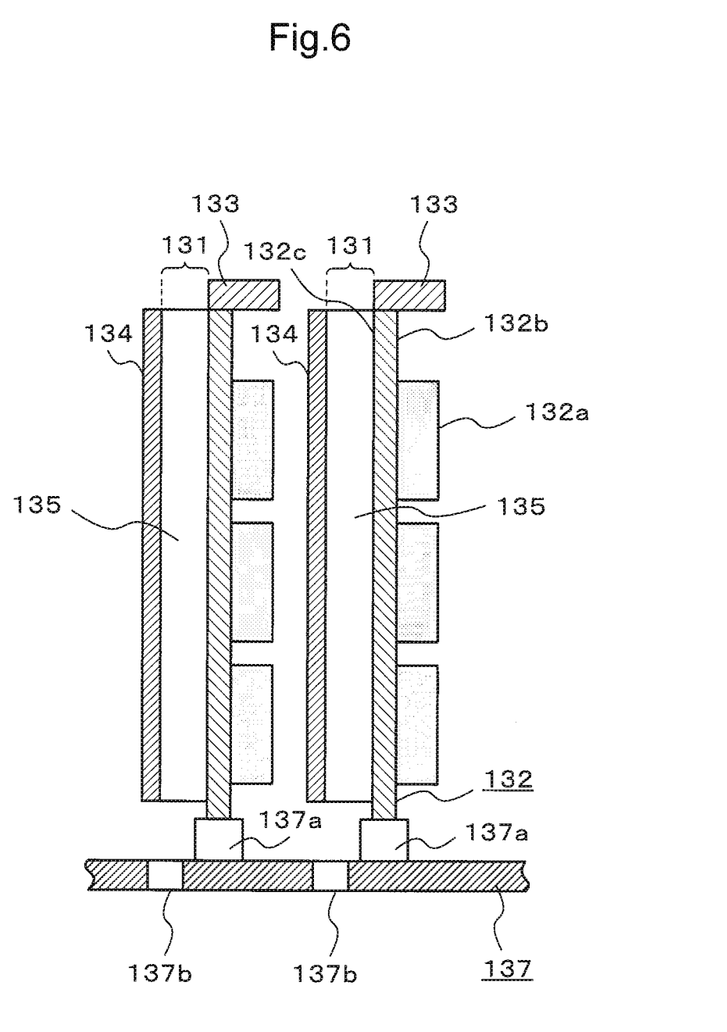
FIG. 6 is a diagram for describing an arrangement relation between substrate modules and a relay substrate.

The substrate mounting unit 130 is provided at the front side inside the housing 100. The substrate mounting unit 130 contains a plurality of electronic substrates 132 under the state where their faces are opposite to one another. That is, the plurality of electronic substrates 132 is mounted under the state where the faces of any two mutually adjacent ones of the plurality of electronic substrates 132 are opposite to each other. The plurality of electronic substrates 132 is contained inside the substrate mounting unit 130 under the state where the faces of the respective electronic substrates 132 are opposite to one another. More specifically, as shown in FIG. 6 described below, in the substrate mounting unit 130, a first face 132b of a certain electronic substrate 132 and a second face 132c of an electronic substrate 132 which is adjacent to this certain electronic substrate 132 are arranged so as to be opposite to each other via a heat radiation path formation unit 134. The configuration of the substrate mounting unit 130 will be described in detail by using FIGS. 4 to 6 in addition to FIGS. 1 to 3.

Figure 4B:
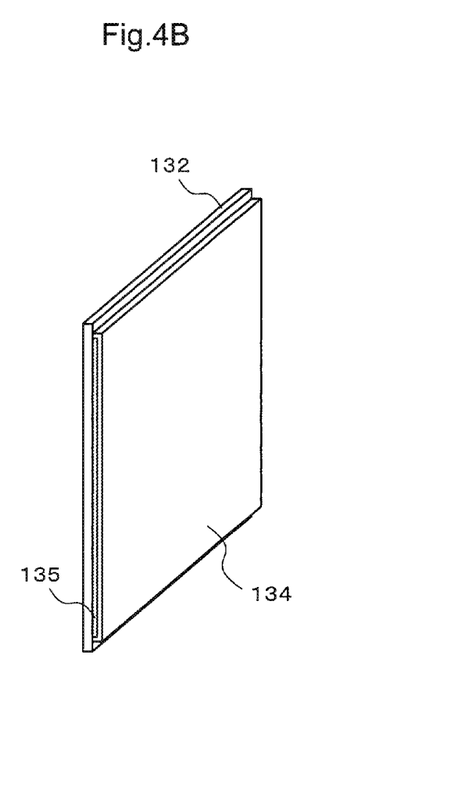

FIG. 4B and FIG. 4B illustrates a configuration of a substrate unit 136 including the electronic substrate 132. FIG. 4A is a perspective view schematically illustrating the substrate unit 136. FIG. 4B is a sectional view of the substrate unit 136, taken along a cross-sectional face X-X shown in FIG. 4A. FIG. 5A and FIG. 5B illustrates a structure of the substrate unit 136. FIG. 5A illustrates a configuration of 137 for holding the plural substrate units 136. FIG. 5B illustrates a state where the substrate unit 136 is attached to the relay substrate 137. FIG. 6 is a diagram illustrating an arrangement relation between the substrate units 136 and the relay substrate 137, and is a sectional view schematically illustrating a state where the substrate units 136 are attached to the relay substrate 137.

As shown in FIGS. 4 to 6, the substrate unit 136 is configured to include the electronic substrate 132 on which a plurality of electronic parts 132a is mounted, a front plate 133 and the heat radiation path formation unit 134.

The front plate 133 is attached to an edge face of the electronic substrate 132 by means of, for example, screw fastening, as shown in FIG. 4A and FIG. 6. As shown in FIG. 4A, a pair of screw retaining units 133a and connector sockets 133b and 133c are arranged on the front plate 133. A screw is retained at each of the screw retaining units 133a. The front plate 133 is fastened to the front side of the housing 100 by using the screws retained at the respective screw retaining units 133a. The connector sockets 133b and 133c are electrically connected to a circuit of the electronic substrate 132. Further, a connector (not illustrated) of an external device (not illustrated) can be connected to each of the connector sockets 133b and 133c.

The heat radiation path formation unit 134 is provided between every pair of adjacent ones of the plurality of electronic substrates 132, as shown in FIG. 6. Here, the electronic substrate 132 has the first face 132b on which exothermic ones of the electronic parts 132a are mounted and the second face 132c on which any of the exothermic ones of the electronic parts 132a is not mounted. The exothermic ones of the electronic parts 132a mean active parts each having the function of allowing the circuit of the electronic substrate 132 to operate, and correspond to LSIs such as a CPU, transistors, amplifiers, modulators, demodulators and the like. On the other hand, passive components, such as resistors, capacitors and coils, which do not have the function of allowing the circuit of the electronic substrate 132 to operate, do not correspond to the exothermic ones of the electronic parts 132. Any part which does not correspond to the exothermic ones of the electronic parts 132 may be mounted on the second face 132c. The heat radiation path formation unit 134 is attached to the second face 132c side of the electronic substrate 132. At this time, as shown in FIG. 4B and FIG. 6, an air gap which is an air passing path is provided between the second face 132c of the electronic substrate 132 and the heat radiation path formation unit 134, and this air gap becomes a heat radiation path 135. This heat radiation path 135 is formed between every two adjacent ones of the electronic substrates 132 so as to be along the second face 132c of each of the electronic substrates 132. Further, air which is taken in to the inside of the housing 100 by the power-supply fan unit 170 passes through the heat radiation path 135, so that this air is conducted to the power supply unit 160 through the heat radiation path 135. In addition, as a material for the heat radiation path formation unit 134, a plastic material or a metallic material, such as aluminum or phosphor bronze, is employed. In the case where an electrically conductive member is employed as the material for the heat radiation path formation unit 134, electric charges generated on the heat radiation path formation unit 134 can be grounded by connecting the heat radiation path formation unit 134 to, for example, a ground pattern (not illustrated) of the electronic substrate 132, or the front plate 132.

As shown in FIG. 1A, FIG. 1B, FIG. 4A and FIG. 6, the power-supply air intake openings 131 are arranged at the front side of the substrate mounting unit 130. Further, the power-supply air intake opening 131 is formed at the front side of the heat radiation path formation unit 134. As shown in FIG. 1B, the power-supply air intake opening 131 is located so as to be opposite to the power-supply fan unit 160 via the substrate mounting unit 130 and the power supply unit 160. The power-supply air intake opening 131 is formed on the heat radiation path 135. That is, the power-supply air intake opening 131 is formed at an inner side of an opening formed by the heat radiation path formation unit 134. In an example of FIG. 4A, with respect to the power-supply air intake opening 131, a plural number of air intake openings are formed so as to align in the longitudinal direction along the opening formed by the heat radiation path formation unit 134. In this regard, however, the number of these air intake openings included in the power-supply air intake opening 131 may be singular or plural, provided that an air intake opening or air intake openings is or are at least formed at the inner side of the opening formed by the heat radiation path formation unit 134.

As described above, the formation of the heat radiation path formation unit 134 makes it possible to allow air outside the housing 100, which is taken in from the power-supply air intake opening 131 by the power-supply fan unit 170, to pass through the heat radiation path 135.

The relay substrate 137 holds the plurality of electronic substrates 132 as shown in FIG. 5B and FIG. 6. The relay substrate 137 has connectors 137a and relay-substrate air ventilation openings 137b. The relay substrate 137 is provided inside the housing 100 so as to extend in the direction substantially orthogonal to the faces of the respective plurality of electronic substrates 132. In addition, the relay substrate 137 corresponds to a substrate holding unit according to another aspect of the present invention, and the relay-substrate ventilation opening 137b corresponds to a ventilation opening according to another aspect of the present invention.

As shown in FIG. 5A, the individual connectors 137a are mounted on the relay substrate 137 at intervals of an approximately equal distance. As shown in FIG. 5B and FIG. 6, the electronic substrate 132 included in the substrate unit 136 is attached to each of the connectors 137a. In this way, the substrate unit 136 including the electronic substrate 132 is held by the relay substrate 137. Further, the relay substrate 137 and an electronic circuit inside the electronic substrate 132 are electrically connected to each other.

The relay-substrate ventilation openings 137b are slit-like shaped openings formed on the relay substrate 137 as shown in FIG. 5A, FIG. 5B and FIG. 6. The relay-substrate ventilation openings 137b are each formed between every two adjacent ones of the connectors 137a to which the respective electronic substrates 132 are attached. Further, as shown in FIG. 6, the relay-substrate ventilation openings 137b are formed so as to be located on the heat radiation paths 135 when the electronic substrates 132 are attached to the connectors 137a, respectively. In this way, air taken in from the power-supply air intake opening 131 by the power-supply fan unit 170 passes through the radiation path 135, then, goes through the relay-substrate ventilation opening 137b, and flows out to the outside of the rear side of the housing 100 via the power supply unit 160.

Hereinbefore, the configuration of the substrate mounting unit 130 has been described in detail with reference to FIGS. 4 to 6 in addition to FIGS. 1 to 3.

Next, referring to FIGS. 1 to 3 again, the device air intake unit 140 is provided at a position which is located under the substrate mounting unit 130 (i.e., which is located at the lower side of the housing 100) and which is located in front of the power supply unit 160. This device air intake unit 140 is provided in order to flow air outside the housing 100 into the substrate mounting unit 130 from the front side of the housing 100. Further, the device air intake opening 141 is provided at the front side of the device air intake unit 140. This device air intake opening 141 is provided in order to flow air outside the front side of the housing 100 to the inside of the housing 100.

The power supply unit 160 is provided behind the substrate mounting unit 130 and the device air intake unit 140. The power supply unit 160 supplies electric power to each of the electronic substrates 132 and the like inside the substrate mounting unit 130.

Further, the power supply unit 160 supplies electric power to the device fan unit 120, the individual electronic substrates 132 inside the substrate mounting unit 130, the power-supply fan unit 170 and the like, in addition to the substrate mounting unit 130.

The power-supply fan unit 170 is provided at the rear side of the housing 100. In the example shown in FIG. 1, FIG. 2 and FIG. 3, with respect to the power-supply fan unit 170, a fan unit incorporated in the power supply unit 160 is illustrated. In this regard, however, the power-supply fan unit 170 does not need to be incorporated in the power supply unit 160 but may be constituted by a body different from that of the power supply unit 170. The power-supply fan unit 170 is provided in order to cool the power supply unit 160. The power-supply fan unit 170 takes in air from the power-supply air intake openings 131, and discharges this taken-in air to the outside of the rear side of the housing 100 via the radiation paths 135 provided inside the substrate mounting unit 130, and the power supply unit 160.

Hereinbefore, the cooling structure of the electronic device 1000 according to this embodiment of the present invention has been described on the basis of FIGS. 1 to 6.

Next, cooling routes of the electronic device 1000 according to this embodiment of the present invention will be described mainly on the basis of FIG. 1B. As shown in FIG. 1B, the cooling inside the electronic device 1000 is performed so as to be separated into a cooling route A for cooling the substrate mounting unit 130 (including the plurality of electronic substrates 132) and a cooling route B for cooling the power supply unit 160.

First, the cooling route A will be described. The drive of the device fan unit 120 allows air outside the housing 100 to flow into the device air intake opening 141 provided at the front side of the electronic device 1000. This air passes through the device air intake unit 140, flows through the substrate mounting unit 130 from the lower side to the upper side thereof, and flows out from the device air discharge opening 111 via the device air discharge unit 110. In this way, in the cooling route A, air outside the housing 100 is taken in to the inside of the substrate mounting unit 130 by using the device fan unit 120 and is discharged from the device air discharge opening 111 to the outside of the housing 100. Through this mechanism, the electronic substrates 132 and the like inside the substrate mounting unit 130 are cooled.

Next, the cooling route B will be described. The drive of the power-supply fan unit 170 allows air outside the housing 100 to flow into the power-supply air intake openings 131 provided at the front side of the electronic device 1000. This air is conducted to the inside of the power supply unit 160 through the radiation paths 135 provided in the substrate mounting unit 130, and flows out from the power-supply fan unit 170 to the outside of the housing 100 (i.e., to the outside of the rear side of the housing 100). In this way, air outside the housing 100 is conducted to the power supply unit 160 via the radiation paths 135 by using the power-supply fan unit 170, and is discharged to the outside of the rear side of the housing 100. Through this mechanism, the power supply unit 170 located behind the substrate mounting unit 130 is cooled.

Hereinbefore, the cooling routes of the electronic device 1000 according to this embodiment of the present invention have been described.

As described above, the electronic device 1000 according to this embodiment of the present invention is configured to include the housing 100, the substrate mounting unit 130, the power supply unit 160, the power-supply air intake opening 131 (the air intake opening) and the power-supply fan unit 170 (the air blowing unit). The housing 100 is configured to contain the plurality of electronic substrates 132 on each of which electronic parts are mounted. The substrate mounting unit 130 is provided at the front side inside the housing 100 and contains the plurality of electronic substrates 132 under the state where they are arranged therein so as to be opposite to one another. The power supply unit 160 is provided at a position which is located at the rear side inside the housing 100 and is located behind the substrate mounting unit 130. Further, the power supply unit 160 supplies electric power to each of the plurality of electronic substrates 132. The power-supply air intake opening group 131 (the air intake opening) is provided at the front side of the substrate mounting unit 130 in order to take in air outside the housing 100 from the front side of the housing 100 to the inside of the housing 100. The power-supply fan unit 170, which is provided at the rear side of the power supply unit 160, takes in air outside the housing 100 from the front side of the housing 100 and discharges the taken-in air to the outside of the rear side of the housing 100 via the substrate mounting unit 130 and the power supply unit 160. Further, the electronic substrate 132 has the first face 132b on which exothermic ones of the electronic parts 132a are mounted, and the second face 132c on which any of the exothermic ones of the electronic parts 132a is not mounted. Further, in the substrate mounting unit 130, there are provided the radiation paths 135 each of which is formed between every two adjacent ones of the plurality of electronic substrates 132 so as to be along the second face 132c of each of the electric substrates 132, and each of which conducts air which is taken in by the power-supply fan unit 170 to the power supply unit 160.

As described above, according to the embodiment of the present invention, the power supply unit 160 is provided behind the substrate mounting unit 130 and the power-supply fan unit 170 is provided at the rear side of the power supply unit 160, and thus, the substrate mounting unit 130, the power supply unit 160 and the power-supply fan unit 170 are successively arranged in the direction from the front side to the rear side of the housing 100.

Further, the radiation paths 135, which conduct air taken in by the power-supply fan unit 170 to the power supply unit 160, are each provided between every two adjacent ones of the plurality of electronic substrates 132 inside the substrate mounting unit 130. Thus, although the substrate mounting unit 130 is located in front of the power supply unit 160, the drive of the power-supply fan unit 170 makes it is possible to conduct air outside the housing 100, which is taken in from the front side of the housing 100, to the power supply unit 160 via the radiation paths 135.

In particular, since the radiation paths 135 are each provided by using a space at the second face 132c side where any of the exothermic ones of the electronic parts 132a is not mounted, it is possible to efficiently conduct air outside the housing 100 up to the power supply unit 160 which is located behind the substrate mounting unit 130. Thus, differing from the typical electronic device 800 shown in FIG. 7A and FIG. 7B, it is unnecessary to provide an air intake unit dedicated to a power supply unit at the front side of the housing 100, and thus, the size of the electronic device 1000 can be kept small.

Further, any of exothermic ones of the electronic parts 132a is not mounted on the second face 132c side, and thus, as compared with a case where a heat radiation path is formed along the first face 132b on which exothermic ones of the electronic parts 132a are mounted, the formation of the radiation path 135 along the second face 132c prevents application of heat to taken-in air to a greater degree.

Moreover, differing from the typical electronic device 800A shown in FIG. 8A and FIG. 8B, it is unnecessary to provide an air intake opening dedicated to a power supply unit at the rear side of the housing 100 where the power-supply fan unit 170 is provided, and thus, it is also possible to, without causing a situation in which the power-supply fan unit 170 takes in air having been discharged by the power-supply fan unit 170 itself, prevent the power supply unit 160 from being exposed to intense heat of the air having been discharged by the power-supply fan unit 170. As a result, it is possible to keep the size of the device 1000 small, and at the same time, efficiently cool the power supply unit 160 which is located behind the substrate mounting unit 130.

In the electronic device 1000 according to this embodiment of the present invention, the substrate mounting unit 130 has the relay substrate 137 (the substrate holding unit) for holding the electronic substrates 132. This relay substrate 137 is provided so as to extend in the direction substantially orthogonal to the faces of the respective electronic substrates 132. Further, the relay substrate 137 has the relay-substrate ventilation openings 137b. These relay-substrate ventilation openings 137b are each formed in a slit-like shape between every two adjacent ones of the plurality of electronic substrates 132, and are located on the respective radiation paths 135. Through this mechanism, air having passed through the radiation paths 135 can be conducted to the power supply unit 160 via the relay-substrate ventilation openings 137b so as not be intercepted by the relay substrate 137.

In the electronic device 1000 according to this embodiment of the present invention, the power-supply air intake opening 131 (the air intake opening) is located on each of the radiation paths 135. Through this mechanism, air outside of the front side of the housing 100 is allowed to efficiently flow into the radiation paths 135, and further, is conducted to the power supply unit 160 via the radiation paths 135. In this way, it is possible to efficiently conduct air outside of the front side of the housing 100 to the power supply unit 160 by providing the power-supply air intake openings 131 on the respective radiation paths 135.

The electronic device 1000 according to this embodiment of the present invention further includes the device air intake opening 141 (the second air intake opening) and the device fan unit 120 (the second air blowing unit). The device air intake opening 141 is provided at a position which is located below the substrate mounting unit 130 and is located at the front side of the housing 100, in order to take in air outside the housing 100 to the inside of the housing 100 from the front side of the housing 100. The device fan unit 120 is provided at the upper side of the housing 100, and takes in air outside the housing 100 from the device air intake unit 141. Further, the device fan unit 120 discharges the taken-in air to the outside of the upper rear side of the housing 100 via the substrate mounting unit 130. Through this mechanism, it is possible to flow air outside of the front side of the housing 100 into the substrate mounting unit 130. As a result, it is possible to cool the electronic substrates 132 inside the substrate mounting unit 130 separately from the cooling of the power supply unit 160.

Hereinbefore, the embodiment according to the present invention has been described with reference to the drawings, but, obviously, the present invention is not limited to the embodiment described above. Various configurations, combinations and the like of the individual constitutive members having been described in the aforementioned embodiment are just examples, and various changes which can be understood by the skilled in the art can be made within a scope not departing from the gist of the present invention.

This application is based upon and claims the benefit of priority from Japanese Patent Application No. 2011-089296, filed on Apr. 13, 2011, the disclosure of which is incorporated herein in its entirety by reference.

INDUSTRIAL APPLICABILITY

The electronic device according to the present invention can be applied to, for example, a device which contains a plurality of electronic substrates on each of which electronic parts are mounted.

The invention claimed is:

1. An electronic device, comprising:
a housing that contains a plurality of electronic substrates on each of which an electronic part is mounted, each of the plurality of electronic substrates includes a first face on which the electronic part, including an exothermic electric part, is mounted and a second face on which the exothermic electronic part is not mounted;
a substrate mounting unit that is provided inside the housing at a front side of the housing, and that contains the plurality of electronic substrates in parallel;
a power supply unit that is provided at a position inside the housing which is located at a rear side of the housing and is located behind the substrate mounting unit, and that supplies the plurality of electronic substrates with electric power;
a first air intake opening that is provided at a front side of the substrate mounting unit in order to take in air outside the housing from the front side of the housing to an inside of the housing;
a first air blowing unit that is provided at a rear side of the power supply unit, and that takes in the air outside the housing from the first air intake opening and discharges the taken-in air to an outside of the rear side of the housing via the substrate mounting unit and the power supply unit; and
a heat radiation path formation unit is formed so as to be along the second face of each of the plurality of electronic substrates, a respective one of the heat radiation path formation unit is provided between every two adjacent ones of the plurality of electronic substrates and forms a first heat radiation path which conducts the air taken in by the first air blowing unit from the first air intake opening, between the heat radiation path formation unit and the second face of a respective one of the plurality of electronic substrates within the substrate mounting unit to the power supply unit;
a second air intake opening that is provided at the front side of the housing, in order to take in the air outside the housing from the front side of the housing to the inside of the housing;
a second air blowing unit that takes in the air outside the housing from the second air intake opening and discharges the taken-in air to the rear side of the housing;
a second radiation path which conducts the air taken in by the second air blowing unit from the second air intake opening, between each heat radiation path formation unit and the first face of a respective one of the plurality of electronic substrates within the substrate mounting unit, to the rear side of the housing,
wherein the second radiation path passing through the plurality of electronic substrates is in a different direction then the first heat radiation path.

2. The electronic device according to claim 1, wherein the substrate mounting unit includes a substrate holding unit that is provided so as to extend in a direction substantially orthogonal to faces of the respective electronic substrates, and that holds the electronic substrates, and wherein the substrate holding unit includes a plurality of ventilation openings thereon each being formed in a slit-like shape at a position between the every two adjacent ones of the plurality of electronic substrates, and each of the plurality of ventilation openings is located on the heat radiation path.

3. The electronic device according to claim 1, wherein the air intake opening is located on the first heat radiation path.

4. The electronic device according to claim 1, wherein the second air intake opening is provided at a position, which is located below the substrate mounting unit and is located at the front side of the housing, in order to take in the air outside the housing from the front side of the housing to the inside of the housing; and the second air blowing unit is provided at an upper side of the housing, and that takes in the air outside the housing from the second air intake opening and discharges the taken-in air to an outside of an upper rear side of the housing.

5. The electronic device according to claim 1, wherein the second air intake opening is provided at a position located below the substrate mounting unit and is located at the front side of the housing.

6. The electronic device according to claim 5, wherein the second air intake opening is configured to take in the air outside the housing from the front side of the housing to the inside of the housing.

7. The electronic device according to claim 6, wherein the second air blowing unit is provided at an upper side of the housing.

8. The electronic device according to claim 7, wherein the second air blowing unit is configured to take in the air outside the housing from the second air intake opening.

9. The electronic device according to claim 8, wherein the second air blowing unit is further configured to discharge the taken-in air to an outside of an upper rear side of the housing.

10. The electronic device according to claim 1, wherein the second air intake opening provided below the substrate mounting-unit at the front side of the housing.

11. The electronic device according to claim 10, wherein the second air blowing unit is provided at an upper side of the housing.

12. The electronic device according to claim 11, wherein the second air blowing unit is configured to take in the air outside the housing from the second air intake opening.

13. The electronic device according to claim 12, wherein the second air blowing unit is further configured to discharge the taken-in air to an outside of an upper rear side of the housing.

14. The electronic device according to claim 12, wherein the second air blowing unit is further configured to discharge the taken-in air to an outside of an upper rear side of the housing via the substrate mounting unit.

* * * * *